US010575448B1

(12) United States Patent
Lewis et al.

(10) Patent No.: US 10,575,448 B1
(45) Date of Patent: Feb. 25, 2020

(54) ELECTROMAGNETIC SHIELDING OF HEAT SINKS WITH SHAPE-MEMORY ALLOY GROUNDING

(71) Applicant: INTERNATIONAL BUSINESS MACHINES CORPORATION, Armonk, NY (US)

(72) Inventors: Theron L. Lewis, Rochester, MN (US); Timothy P. Younger, Rochester, MN (US); David J. Braun, St. Charles, MN (US); James D. Bielick, Pine Island, MN (US); Jennifer Bennett, Rochester, MN (US); Stephen M. Hugo, Stewartville, MN (US); John R. Dangler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/191,788

(22) Filed: Nov. 15, 2018

(51) Int. Cl.
  *H05K 1/02* (2006.01)
  *H05K 1/18* (2006.01)
  *H05K 9/00* (2006.01)
(52) U.S. Cl.
  CPC ......... *H05K 9/0081* (2013.01); *H05K 1/0201* (2013.01); *H05K 1/0215* (2013.01); *H05K 2201/0308* (2013.01); *H05K 2201/066* (2013.01)
(58) Field of Classification Search
  CPC ..... H05K 1/181; H05K 1/0203; H05K 1/0204
  See application file for complete search history.

(56) References Cited

U.S. PATENT DOCUMENTS

| 6,049,469 | A | 4/2000 | Hood, III et al. | |
|---|---|---|---|---|
| 6,900,383 | B2 | 5/2005 | Babb et al. | |
| 9,629,232 | B2 | 4/2017 | Reilly et al. | |
| 2003/0102553 | A1* | 6/2003 | Ishikawa | H01L 23/3735 257/707 |
| 2004/0086704 | A1* | 5/2004 | Schneider | B32B 5/16 428/323 |
| 2007/0108598 | A1* | 5/2007 | Zhong | H01L 23/3128 257/707 |
| 2016/0320149 | A1 | 11/2016 | Poltorak | |

FOREIGN PATENT DOCUMENTS

JP  06163758 A  6/1994

OTHER PUBLICATIONS

Armstrong, "EMC Techniques for Heatsinks", First published in the EMC Journal, Issue 89, Jul. 2010, pp. 31-38.
(Continued)

*Primary Examiner* — Jeremy C Norris
(74) *Attorney, Agent, or Firm* — Tihon Poltavets (57) ABSTRACT

An apparatus for grounding a heat sink utilizing shape-memory alloy includes a printed circuit board, a logic chip, a heat sink, and a first grounding member, wherein the first grounding member is a shape-memory alloy. The apparatus further includes the logic chip electrically coupled to the printed circuit board and the heat sink disposed on a top surface of the logic chip. The apparatus further includes a first end of the first grounding member electrically coupled to the heat sink, wherein a second end of the grounding first member is disposed on a first ground land of the printed circuit board.

20 Claims, 5 Drawing Sheets

(56) References Cited

OTHER PUBLICATIONS

Divaker, "Patent Application Review: Integrated Heat Sink and EMI Shield Assembly" (US 20160227673), https://www.electronics-cooling.com/2016/11/patent-application-review- . . . , Nov. 1, 2016, pp. 1-8.
Wikipedia, "Shape-memory alloy", https://en.wikipedia.org/wiki/Shape-memory_alloy, printed Jun. 15, 2018, pp. 1-8.
Youtube, "(16) Nitinol—Metallic Muscles with Shape Memory.—YouTube", https://www.youtube.com/watch?v=-K57cbOhA5g, printed Nov. 15, 2018, pp. 1-2.

* cited by examiner

ELECTROMAGNETIC SHIELDING OF HEAT SINKS WITH SHAPE-MEMORY ALLOY GROUNDING

FIELD OF THE INVENTION

This disclosure relates generally to electromagnetic shielding, and in particular, to electromagnetic shielding of heat sinks utilizing shape-memory alloys for grounding.

BACKGROUND OF THE INVENTION

Metal heat sinks can provide heat dissipation to various components on a printed circuit board (PCB), with an unintended consequence of causing electromagnetic interference (EMI) or noise due to stray currents that are absorbed during routine operations. The stray currents typically occur when voltages of various components or power transistors fluctuate, resulting in an emission of capacitance into the metal heat sink. Electromagnetic shielding on the metal heat sink reduces the intensity of an electromagnetic field in a given space by blocking the electromagnetic field utilizing various barrier and grounding techniques. By grounding out the metal heat sink, the stray currents can be removed and EMI can be reduced.

SUMMARY

One aspect of an embodiment of the present invention discloses an apparatus for a grounded heat sink utilizing a shape-memory alloy, the apparatus comprising a printed circuit board, a logic chip, a heat sink, and a first grounding member, wherein the first grounding member is a shape-memory alloy; the logic chip electrically coupled to the printed circuit board; the heat sink disposed on a top surface of the logic chip; and a first end of the first grounding member electrically coupled to the heat sink, wherein a second end of the grounding first member is disposed on a first ground land of the printed circuit board.

A second aspect of an embodiment of the present invention discloses a method comprising applying heat to a shape-memory alloy; machining the shape-memory alloy according to a location of a ground land on a printed circuit board and a placement of a heat sink on a logic chip electrically coupled to the printed circuit board; attaching a first end of the shape-memory alloy to the heat sink; responsive to a cooling of the shape-memory alloying, deforming the shape-memory alloy towards the heat sink; attaching the heat sink to the logic chip; and applying heat to the printed circuit board, wherein applying heat causes a second end of the shape-memory alloy to establish an electrical connection with the ground land on the printed circuit board.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Shape-memory alloys (SMA, smart metal, memory alloy, muscle wire, memory metal, smart alloy) are metals or metal mixtures that can revert back to an original shape, where a shape-memory alloy in a deformed state returns to a pre-deformed state when heat is applied. Embodiments of the present invention provide electromagnetic shielding to metal heat sinks utilizing shape-memory alloys in conjunction with room temperature curing of thermal interface material (TIM) adhesives and/or mechanical attach stack-ups. Specifically, shape-memory alloy members are coupled at one end to a metal heat sink, such that when heat is applied to the heat sink and chip assembly, the shape-memory alloy members actuate towards grounding lands on a printed circuit board (PCB). The activation of the shape-memory alloy members does not cause a disruptive force to the heat sink attachment process and maintains an integrity of the TIM adhesive bonding process.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 1A:
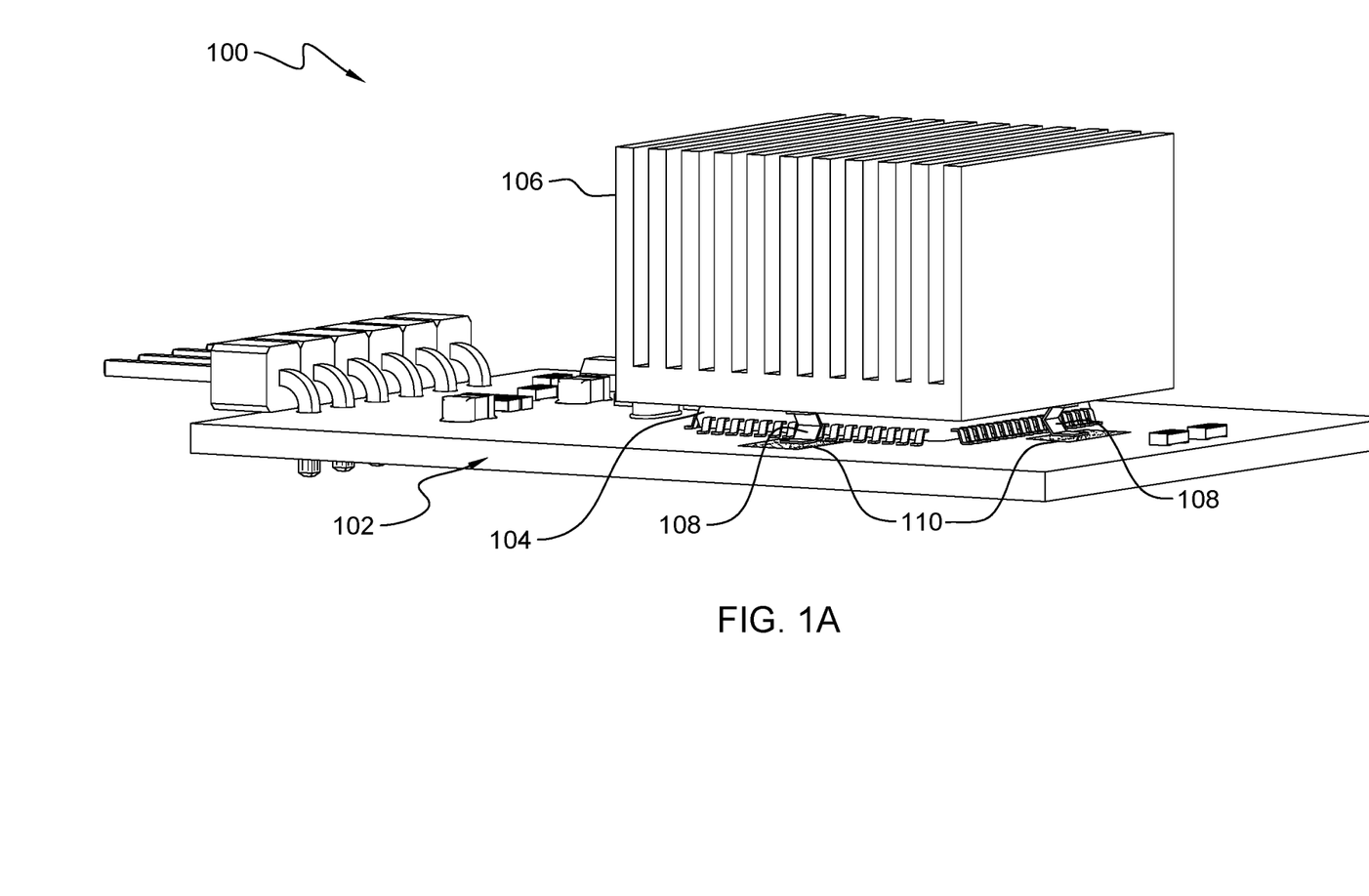
FIG. 1A depicts a grounded heat sink coupled and grounded to a printed circuit board assembly, in accordance with an embodiment of the present invention.

FIG. 1A depicts a grounded heat sink coupled and grounded to a printed circuit board assembly, in accordance with an embodiment of the present invention. Printed circuit board (PCB) assembly 100 includes PCB 102 with electrically coupled logic chip 104, along with various other electrically coupled components. Heat sink 106 is disposed on top of logic chip 104, where heat sink 106 is grounded to PCB 102 via multiple grounding members 108 disposed on multiple grounding lands 110. PCB 102 represents a mechanical support for electrically connecting various electronic components or electrical components, such as logic chip 104. Due to the thermal properties of logic chip 104, heat sink 106 is required to provide heat exchange between logic chip 104 and the surrounding environment. Grounding members 108 are shape-memory alloys such as, Copper-Aluminum-Nickel or Nickel-Titanium (NiTi), where grounding member 108 are deformable structures that can revert to a pre-deformed state once heat is applied. In this embodiment, grounding members 108 are rectangular beams that are V-shaped, where grounding members 108 are deformable at a vertex of the V-shaped beam. For example, grounding member 108 in a pre-deformed state forms a 110° angle at the vertex, where the pre-deformed state is illustrated in FIG. 1A. Grounding member 108 in a deformed state forms an angle in the 50°<x<110° angle range, where the deformed state represent heat sink 106 coupled to logic chip 104 but prior to being electrically grounded at grounding lands 110. The angle range of the deformed state of grounding member 108 is dependent on the properties of the shape-memory alloy being utilized, since angles falling outside of the deformed state angle range may affect how the grounding member 108 actuates.

In this embodiment, heat sink 106 is square in shape and utilizes four separate grounding members 108, where each of the four separate grounding members 108 includes a corresponding grounding land 110. Due to the orientation of PCB assembly 100 in FIG. 1A, only two of the four grounding members 108 and corresponding grounding lands 110 are visible. In other embodiments, heat sink 106 is rectangular in shape and includes six total grounding members 108 and six corresponding grounding lands 110. Two grounding members 108 are coupled to each length side of heat sink 106 and a single grounding member 108 is coupled to each width side of heat sink 106. Based on a design of PCB 102, two or more grounding members 108 can include a single corresponding grounding land 110. In various other embodiments, other metal components (e.g., metal dust shield or metal support structures) capable of producing electromagnetic interference can be ground utilizing grounding members 108 with corresponding grounding lands 110.

Figure 1B:
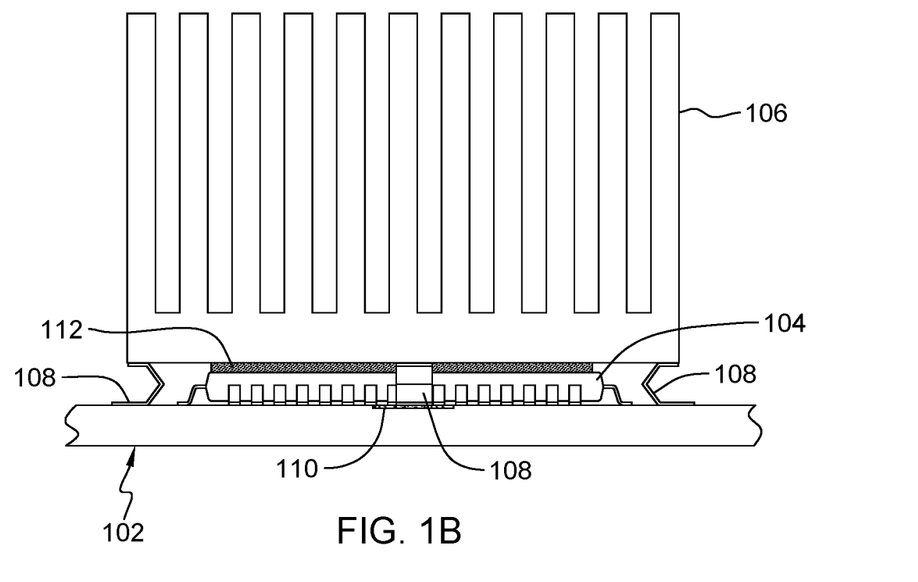
FIG. 1B depicts an enhanced side view of a heat sink coupled and grounded to a printed circuit board assembly, in accordance with an embodiment of the present invention.

FIG. 1B depicts an enhanced side view of a heat sink coupled and grounded to a printed circuit board assembly, in accordance with an embodiment of the present invention. As previously discussed in FIG. 1A, PCB 102 includes logic chip 104 with disposed heat sink 106, where thermal interface material (TIM) adhesive 112 is disposed between logic chip 104 and heat sink 106 to enhance thermal and mechanical coupling. Present on each side of heat sink 106, a first end of grounding member 108 is mechanically and electrically coupled to heat sink 106 and a second end of grounding member 108 is disposed on grounding land 110. Grounding member 108 is shaped such that the second end is bendable towards the first end, where the second end of grounding member 108 does not initially contact grounding land 110 when heat sink 106 is disposed onto TIM adhesive 112 on logic chip 104. As previously discussed, a pre-deformed state of grounding member 108 represents the state prior to the second end being bent towards the first end. A deformed state of grounding member 108 represents the state subsequent to the second end being bent towards the first end. It is to be noted that the pre-deformed state of grounding member 108 can also be referred to as a "remembered" state.

Figure 1C:
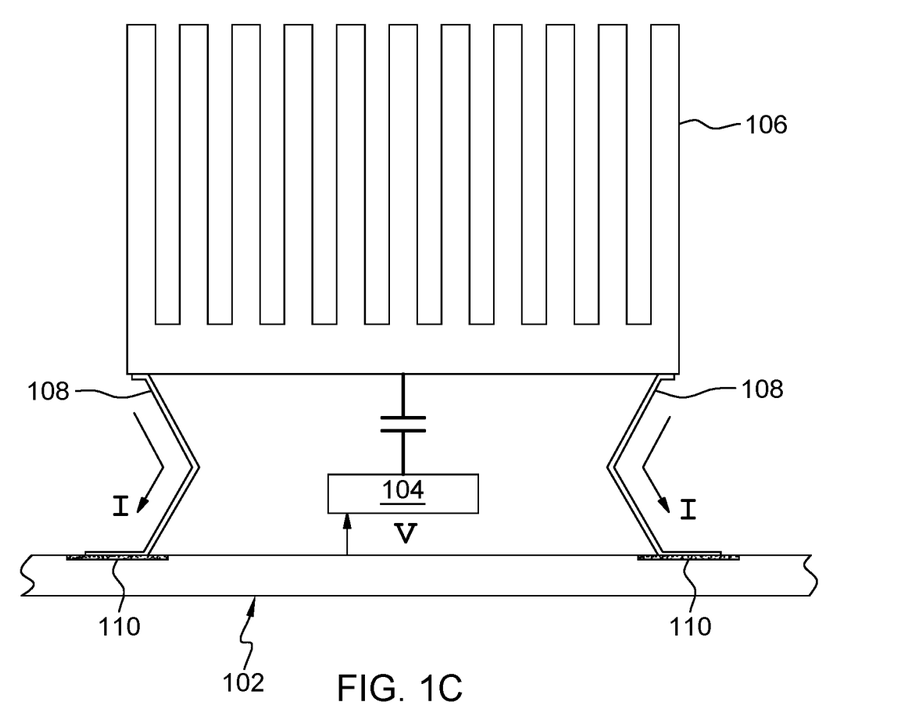
FIG. 1C depicts an enhanced side view of voltage and current flow through a heat sink coupled and grounded to a printed circuit board assembly, in accordance with an embodiment of the present invention.

FIG. 1C depicts an enhanced side view of voltage and current flow through a heat sink coupled and grounded to a printed circuit board assembly, in accordance with an embodiment of the present invention. To reduce electromagnetic interference (EMI) due to current emission through heat sink 106 when a voltage is applied to logic chip 104, grounding members 108 provide a current path to grounding lands 110 on PCB 102 for the emitted current. As previously discussed, multiple grounding members 108 ensures maximum EMI reduction due to stray currents present in heat sink 106 and an amount of grounding members 108 for heat sink 106 is dependent on grounding requirements of the stray currents for a given application.

Figure 2A:
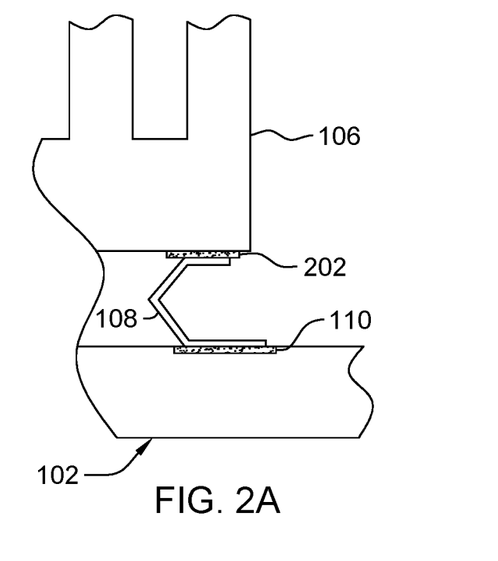
FIG. 2A depicts an enhanced side view of a grounding member coupled to a heat sink utilizing an adhesive, in accordance with an embodiment of the present invention.

FIG. 2A depicts an enhanced side view of a grounding member coupled to a heat sink utilizing an adhesive, in accordance with an embodiment of the present invention. Adhesive 202 is disposed between grounding member 102 and heat sink 106, wherein adhesive 202 is conductive and capable of supporting the weight of grounding member 108. Adhesive 202 is not required to support a portion of the weight of heat sink 106, since TMI adhesive 112 combined with logic chip 104 mechanically and electrically coupled to PCB 102, as previously discussed in FIG. 1B. Adhesive 202 represents any electrically conductive adhesive, where the conductive component can include silver, copper, or graphite and the adhesive component can include a synthetic resin or silicone. Current present in heat sink 106 passes through adhesive 202 to grounding member 108, where the current is grounded at grounding land 110.

Figure 2B:
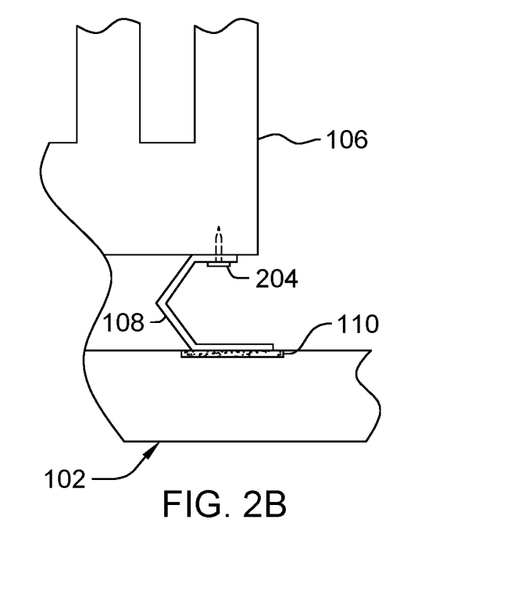
FIG. 2B depicts an enhanced side view of a grounding member coupled to a heat sink utilizing a fastener, in accordance with an embodiment of the present invention.

FIG. 2B depicts an enhanced side view of a grounding member coupled to a heat sink utilizing a fastener, in accordance with an embodiment of the present invention. Fastener 204 mechanically couples grounding member 108 to heatsink 204, without affecting the properties of the shape-memory alloy. During a manufacturing process of grounding member 108, a mounting hole passing through a first end of the grounding member 108 is drilled or molded into the memory-shape alloy itself to allow for fastener 204 to passthrough the mounting hole to couple grounding member 108 into heat sink 106. Fastener 204 allows for the mechanical and electrical coupling between heat sink 106 and grounding member 108. In an alternative embodiment, adhesive 202 is utilized in combination with fastener 204 to mechanically and electrically couple heat sink 106 to grounding member 108. Current present in heat sink 106 passes through fastener 204 and an exposed coupling surface of grounding member 108, where the current is grounded at grounding land 110 as the current travels the length of grounding member 108.

Figure 2C:
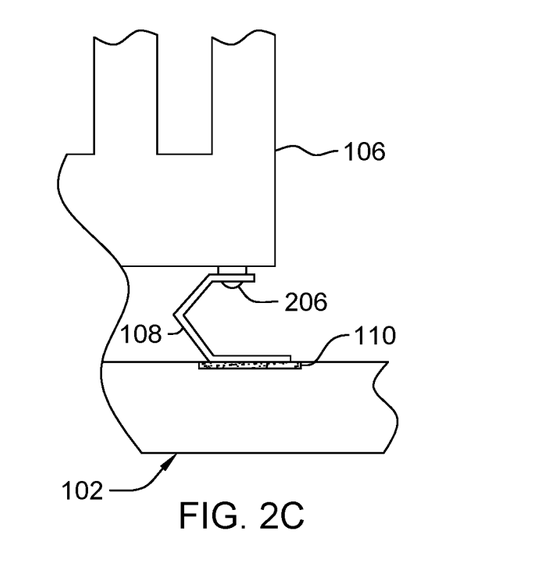
FIG. 2C depicts an enhanced side view of a grounding member coupled to a heat sink utilizing a spot weld, in accordance with an embodiment of the present invention.

FIG. 2C depicts an enhanced side view of a grounding member coupled to a heat sink utilizing a spot weld, in accordance with an embodiment of the present invention. Spot weld 206 couples grounding member 108 to heatsink 204, with minimal effects to the properties of the shape-memory alloy. During a manufacturing process of heat sink 106 with grounding member 108, a first end of grounding member 108 is welded with spot weld 206 to mechanically and electrically couple the first end of grounding member 108 to heat sink 106. In an alternative embodiment, a first end of grounding member 108 is soldered to heat sink 106, where the solder joint mechanically and electrically couple the first end of grounding member 108 to heat sink 106. Current present in heat sink 106 passes through spot weld 206 and any exposed coupling surface of grounding member 108, where the current is grounded at grounding land 110 as the current travels the length of grounding member 108.

Figure 3A:
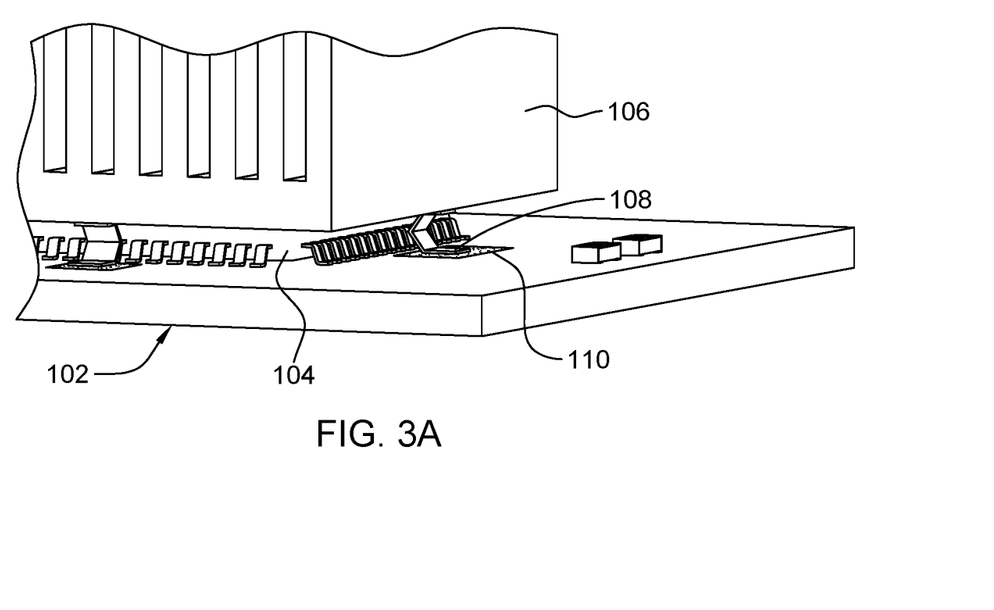
FIG. 3A depicts an enhanced view of a grounding member coupled to a heat sink and disposed on a grounding land of a printed circuit board assembly, in accordance with an embodiment of the present invention.

FIG. 3A depicts an enhanced view of a grounding member coupled to a heat sink and disposed on a grounding land of a printed circuit board assembly, in accordance with an embodiment of the present invention. Heat sink 106 disposed on logic chip 104 mechanically and electrically coupled to PCB 102, is electrically grounded to ground lands 110 via grounding members 108. Grounding members 108 are located in an area between an outer edge of heat sink 106 and a mounting area of heat sink 106 to logic chip 104, where the area is located on a bottom surface of heat sink 106 opposite a top surface of heat sink 106 that includes multiple heat sink fins. A coupling location within the area for each of the multiple grounding members 108 is dependent on a location of the multiple corresponding grounding lands 110. In another embodiment, a first end of grounding member 108 is electrically and mechanical coupled to a side surface of heat sink 106, where a second end of grounding member 108 is disposed on grounding land 110. The side surface of heat sink 106 is an exterior surface located perpendicular and between the bottom surface of heat sink 106 and the top surface of heat sink with the heat sink fins.

Figure 3B:
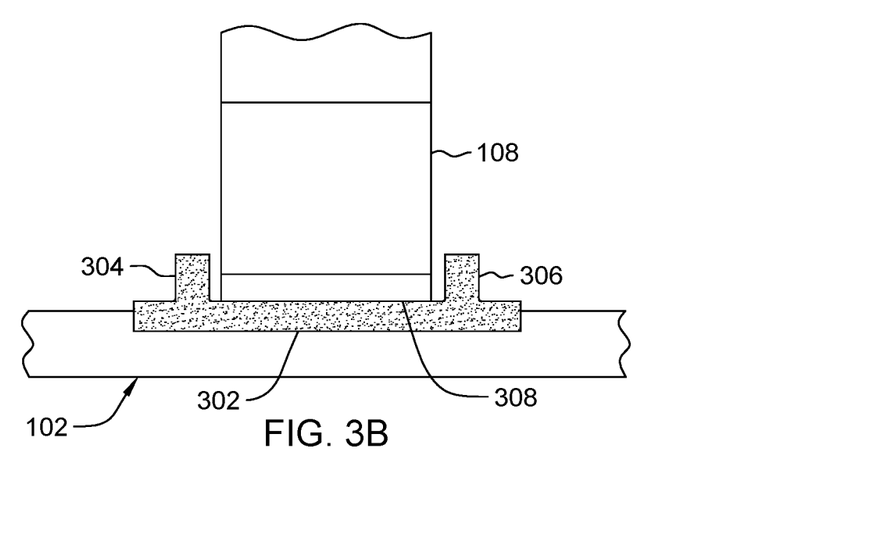
FIG. 3B depicts an enhanced front view of a grounding member disposed on a grounding land with channels on a printed circuit board assembly, in accordance with an embodiment of the present invention.

FIG. 3B depicts an enhanced front view of a grounding member disposed on a grounding land with channels on a printed circuit board assembly, in accordance with an embodiment of the present invention. In this embodiment, channeled grounding land 302 includes guide walls 304 and 306 for placement of grounding member 108 when PCB 102 is heated to actuate grounding member 108 from a deformed to a pre-deformed state. Region 308 located between guide walls 304 and 306 provides an area for grounding member 108 to contact channeled grounding land 302 to provide an electrical ground for heat sink 106 (not illustrated in FIG. 3B). As heat is applied to grounding member 108, grounding member 108 lowers towards channeled grounding land 302, where guide walls 304 and 306 act as barriers for grounding member 108 transitioning between a deformed state to a pre-deformed state. As grounding member 108 falls below a top surface of each of guide walls 304 and 306, grounding member 108 contacts region 308 located in channeled grounding land 302 allowing for the electrical transfer of current between grounding member 108 and channeled grounding land 302.

In an alternative embodiment, guide walls 304 and 306 can include a conductive adhesive or conductive medium into which grounding member 108 can breach when heat is applied to grounding member 108 to actuate the transition between the deform state to the pre-deformed state. As heat is applied, grounding member 108 lowers towards channeled grounding land 302, where guide walls 304 and 306 act as barriers for grounding member 108. As grounding member 108 falls below a top surface of each of guide walls 304 and 306, grounding member 108 contacts the conductive adhesive or conductive material which allows for the electrical transfer of current between grounding member 108 and channeled grounding land 302.

Figure 4:
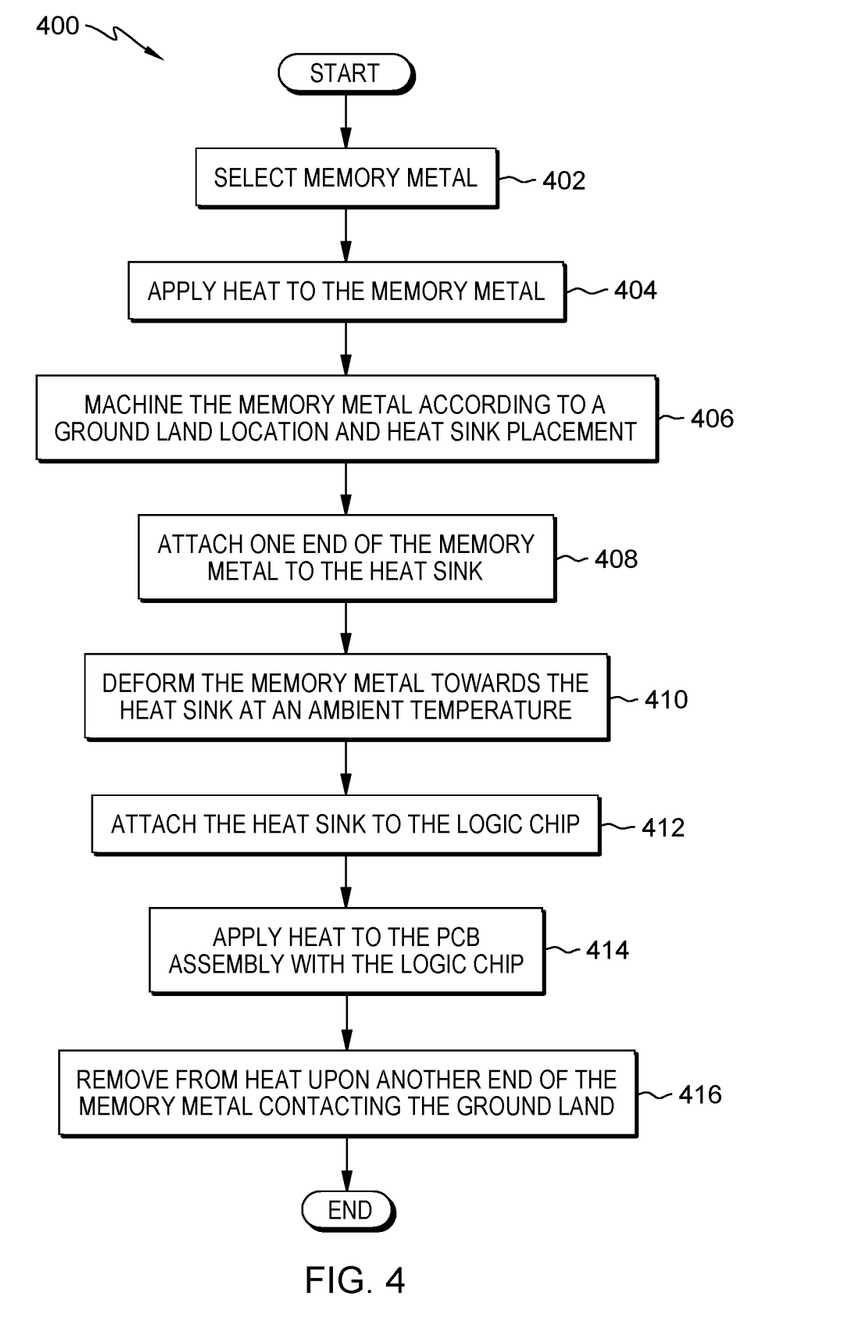
FIG. 4 depicts a process for grounding a heat sink utilizing shape-memory alloy grounding members, in accordance with an embodiment of the present invention.

FIG. 4 depicts a process for grounding a heat sink utilizing shape-memory alloy grounding members, in accordance with an embodiment of the present invention.

The process includes selecting a memory metal (402) for electrically coupling a heat sink to a ground land on a printed circuit board (PCB). Examples of memory metals (i.e., shape-memory alloys) include Copper-Aluminum-Nickel and Nickel-Titanium (NiTi), often referred to as Nitinol. In this embodiment, Nitinol is selected as the memory metal due to a shape transition temperature being in the 90° C. to 110° C. range. The shape transition temperature represents the temperature at which a deformed memory metal returns to a pre-deformed shape when heat is applied. Depending on the electric conductivity of Nitinol, the process can include plating the memory metal (i.e., Nitinol) in gold (Au) prior to machining the memory metal, to increase conductivity, discussed in further detail with regards to (406).

The process further includes applying heat to the memory metal (404) and machining the memory metal according to a ground land location and heat sink placement (406). The memory metal is heated to the shape transition temperature utilizing one or more thermal methods that includes baking, handheld heating apparatus, laser, induction, and radiant heat. In this embodiment, the memory metal (Nitinol) is heated to a value in the 90° C. to 110° C. range and the memory metal is machined based on the heat sink placement relative to the one or more ground land locations on the PCB. Machining the memory metal represents the establishing of a pre-deformed state of the memory metal. Since the heat sink is being attached to a logic chip on the PCB, a first latitudinal height of the machined memory metal should equal or exceed a second latitudinal height measured from a top surface of the PCB to a bottom surface of the heat sink. The second latitudinal height includes a sum of a height of the logic chip from the top surface of the PCB and a top surface of the logic chip, and a height of any thermal interface material (TIM) between the top of the logic chip and the bottom of the heat sink. In one example, the first latitudinal height exceeds the second latitudinal height by 10% to account for an variations during the shape transition of the memory metal between a deformed state and a pre-deformed state.

In this embodiment, the memory metal is a rectangular beam that is machined into a V-shaped member, where the latitudinal height is a distance measured between a first end and a second end of the V-shaped member. An angle at a vertex of the V-shaped memory metal is greater (e.g., 110°) when a heat is applied compared to when the memory metal is deformed towards the heat sink (e.g., 100°), discussed in further detail with regards to (410). In another embodiment, the memory metal is a rectangular beam that is machined into a U-shaped member, where the latitudinal height is a distance measured between a first end and a second end of the U-shaped member. In yet another embodiment, the memory metal is a coil, where the latitudinal height is a distance measured between a first end of the coil and a second end of the coil.

The process further includes attaching one end of the memory metal to the heat sink (408). In this embodiment, a first end of the V-shaped memory metal is attached to a bottom surface of the heat sink, where the bottom surface of the heat sink is opposite a surface of the heat sink that includes multiple heat sink fins. The first end of the V-shaped memory metal is attached to the bottom surface of the heat sink utilizing one or more of a conductive adhesive, a fastener, and a spot weld. The second end of the V-shaped memory metal provides a connection to the ground land on the PCB. A location for attaching the first end of the V-Shaped memory metal is such that the second end of the V-Shape memory metal aligns with a corresponding ground land on the PCB. Multiple memory metals are attached to the heat sink, where each of the multiple memory metals includes a corresponding ground land.

In another embodiment, a first end of the U-shaped memory metal is attached to a bottom surface of the heat sink, where the bottom surface of the heat sink is opposite a surface of the heat sink that includes multiple heat sink fins. The second end of the U-shaped memory metal provides a connection to the ground land on the PCB. A location for attaching the first end of the U-Shaped memory metal is such that the second end of the U-Shape memory metal aligns with a corresponding ground land on the PCB. In yet another embodiment, a first end of a coil memory metal is attached to a bottom surface of the heat sink, where the bottom surface of the heat sink is opposite a surface of the heat sink that includes multiple heat sink fins. The second end of the coil memory metal provides a connection to the ground land on the PCB. A location for attaching the first end of the coil memory metal is such that the second end of the coil memory metal aligns with a corresponding ground land on the PCB.

The process further includes deforming the memory metal towards the heat sink at an ambient temperature (410). In this embodiment, the ambient temperature is a room temperature in the 20° C. to 25° C. range, where the memory metal has been cooled from the 90° C. to 110° C. range to the 20° C. to 25° C. range. During the cooling phase, the memory metal maintains the shape machined during (406) in the process. Once the memory metal reaches the ambient temperature, the memory metal is deformed towards the heat sink, where deforming the memory metal toward the heat sink includes decreasing a first latitudinal height of the memory metal as measured from a first end to a second end of the memory metal. The first latitudinal height of the memory metal should be less than a second latitudinal height measured from a top surface of the PCB to a bottom surface of the heat sink. The second latitudinal height includes a sum of a height of the logic chip from the top surface of the PCB and a top surface of the logic chip, and a height of any thermal interface material (TIM) between the top of the logic chip and the bottom of the heat sink. With the first latitudinal height being less than the second latitudinal height, a curing process of thermal interface material is not affected when the heat sink is disposed on the thermal interface material on the logic chip.

The process further includes attaching the heat sink to the logic chip (412), such that the multiple memory metals attached to the bottom surface of the heat sink do not contact the corresponding multiple ground lands. Attaching the heat sink to the logic chip includes disposing the heat sink onto a previously disposed layer of thermal interface material on a top surface of the logic chip.

The process further includes applying heat to the PCB assembly with the logic chip (414), where the logic chip includes the disposed heat sink on top of the thermal interface material. In this embodiment, the PCB assembly with the logic chip is baked at 100° C., where the baking of the PCB assembly allows for the curing of the thermal interface material and the activation of the memory metal for transition between the deformed state to the pre-deformed state. In another embodiment, the PCB assembly with the logic chip is baked at a temperature that increases incrementally (e.g., 5° C. per 5 min.) until the activation of the memory metal occurs, where the memory metal transitions from the deformed state established in (410) to the pre-deformed state machined in (406). Additional heat can be applied to the memory metal with one or more handheld heating apparatus, laser, induction, and radiant heat.

The process further includes removing the memory metal from heat upon another end of the memory metal contacting the ground land (416). As previously discussed, a first end of the memory metal was attached to a bottom surface of the heat sink (408). A second end of the memory metal contacts the ground land during the transition between the deformed state to the pre-deformed state when heat is applied, and an electrical ground is established. Subsequent to the second end of the memory metal contacting the ground land, the heat sink is electrically grounded and the PCB assembly is removed from the heat source.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. An apparatus comprising:
   a printed circuit board, a logic chip, a heat sink, and a first grounding member, wherein the first grounding member is a shape-memory alloy;
   the logic chip electrically coupled to the printed circuit board;
   the heat sink disposed on a top surface of the logic chip; and
   a first end of the first grounding member electrically coupled to the heat sink, wherein a second end of the grounding first member is disposed on a first ground land of the printed circuit board, wherein the grounding member is in a remembered state.

2. The apparatus of claim 1, wherein the second end of the first grounding member is electrically coupled to the ground land.

3. The apparatus of claim 1, wherein the heat sink disposed on a top surface of the logic chip comprises:
   a top surface of the heat sink includes one or more heat sink fins; and
   a bottom surface of the heat sink disposed on the top surface of the logic chip.

4. The apparatus of claim 3, further comprising:
   a thermal interface material disposed between the top surface of the logic chip and the bottom surface of the heat sink.

5. The apparatus of claim 1, wherein the shape-memory alloy is selected from a group consisting of Copper-Aluminum-Nickel and Nickel-Titanium (NiTi).

6. The apparatus of claim 1, wherein the shape-memory alloy is V-Shaped.

7. The apparatus of claim 1, wherein the shape-memory alloy is U-Shaped.

8. The apparatus of claim 1, wherein the shape-memory alloy is a coil.

9. The apparatus of claim 1, wherein a conductive adhesive mechanically couples the first end of the first grounding member to the surface of the heat sink.

10. The apparatus of claim 1, wherein a fastener mechanically couples the first end of the g first rounding member to the surface of the heat sink.

11. The apparatus of claim 1, wherein a spot weld mechanically couples the first end of the first grounding member to the surface of the heat sink.

12. The apparatus of claim 1, wherein a solder joint mechanically couples the first end of the first grounding member to the surface of the heat sink.

13. The apparatus of claim 1, wherein the first end of the first grounding member electrically coupled to the surface of the heat sink is located in a first area between an outer edge of the heat sink and a second area where a bottom surface of the heat sink is disposed on the top surface of logic chip.

14. The apparatus of claim 1, wherein the ground land includes an electric grounding area between a first guide wall and a second guide wall.

15. The apparatus of claim 13, wherein a distance between the first guide wall and the second guide wall is less than a width of the first grounding member.

16. The apparatus of claim 14, further comprising:
a conductive adhesive disposed in the electric grounding area, wherein the first grounding member is disposed on the conductive adhesive.

17. The apparatus of claim 1, further comprising:
a second grounding member, wherein the second grounding member is a shape-memory alloy;
a first end of the second grounding member electrically coupled to the surface of the heat sink, wherein a second end of the grounding first member is disposed on the first ground land of the printed circuit board.

18. The apparatus of claim 1, further comprising:
a second grounding member, wherein the second grounding member is a shape-memory alloy;
a first end of the second grounding member electrically coupled to the surface of the heat sink, wherein a second end of the grounding first member is disposed on a second ground land of the printed circuit board.

19. A method comprising:
applying heat to a shape-memory alloy
machining the shape-memory alloy according to a location of a ground land on a printed circuit board and a placement of a heat sink on a logic chip electrically coupled to the printed circuit board, wherein the shape-memory alloy is in a pre-deformed state subsequent to the machining;
attaching a first end of the shape-memory alloy to the heat sink;
responsive to a cooling of the shape-memory alloying, deforming the shape-memory alloy towards the heat sink to a deformed state;
attaching the heat sink to the logic chip; and
applying heat to the printed circuit board to revert the shape-memory alloy from the deformed state to the pre-deformed state, wherein applying heat causes a second end of the shape-memory alloy to establish an electrical connection with the ground land on the printed circuit board.

20. The method of claim 19, wherein the shape-memory alloy is selected from the group consisting of Copper-Aluminum-Nickel and Nickel-Titanium (NiTi).

* * * * *